(12) United States Patent
Kim et al.

(10) Patent No.: US 11,306,004 B2
(45) Date of Patent: *Apr. 19, 2022

(54) CHALCOGEN-CONTAINING COMPOUND, ITS PREPARATION METHOD AND THERMOELECTRIC ELEMENT COMPRISING THE SAME

(71) Applicant: LG CHEM, LTD., Seoul (KR)

(72) Inventors: Min Kyoung Kim, Daejeon (KR); Yu Ho Min, Daejeon (KR); Cheol Hee Park, Daejeon (KR); Kyung Moon Ko, Daejeon (KR); Chee Sung Park, Daejeon (KR); Jae Hyun Kim, Daejeon (KR); Myung Jin Jung, Daejeon (KR)

(73) Assignee: LG CHEM, LTD., Seoul (KR)

(*) Notice: Subject to any disclaimer, the term of this patent is extended or adjusted under 35 U.S.C. 154(b) by 308 days.

This patent is subject to a terminal disclaimer.

(21) Appl. No.: 16/463,300

(22) PCT Filed: May 11, 2018

(86) PCT No.: PCT/KR2018/005454
§ 371 (c)(1),
(2) Date: May 22, 2019

(87) PCT Pub. No.: WO2019/004591
PCT Pub. Date: Jan. 3, 2019

(65) Prior Publication Data
US 2019/0375654 A1    Dec. 12, 2019

(30) Foreign Application Priority Data

Jun. 27, 2017 (KR) .......................... 10-2017-0081229

(51) Int. Cl.
*C01B 19/00* (2006.01)
*C01G 29/00* (2006.01)

(52) U.S. Cl.
CPC ........ *C01G 29/006* (2013.01); *C01P 2002/30* (2013.01)

(58) Field of Classification Search
None
See application file for complete search history.

(56) References Cited

U.S. PATENT DOCUMENTS

| 6,312,617 B1 * | 11/2001 | Kanatzidis | ............ H01L 31/032 |
| | | | 252/62.3 T |
| 9,653,672 B2 | 5/2017 | Rhyee et al. | |
| 2005/0076944 A1 | 4/2005 | Kanatzidis et al. | |
| 2010/0294326 A1 * | 11/2010 | Guo | ......................... B22F 7/08 |
| | | | 136/238 |
| 2013/0256609 A1 | 10/2013 | Ren et al. | |
| 2016/0099396 A1 | 4/2016 | Lee et al. | |
| 2016/0343928 A1 | 11/2016 | Rhyee et al. | |

FOREIGN PATENT DOCUMENTS

| CN | 108516526 A | 9/2018 |
| EP | 0 271 575 A1 | 6/1988 |
| EP | 2 009 672 A1 | 12/2008 |
| JP | 2008-512001 A | 4/2008 |
| JP | 6053186 B2 | 12/2016 |
| KR | 10-2014-0116668 A | 10/2014 |
| KR | 10-2016-0058517 A | 5/2016 |
| KR | 10-2017-0041540 A | 4/2017 |
| KR | 10-2018-0048313 A | 5/2018 |
| WO | WO 88/00092 A1 | 1/1988 |

OTHER PUBLICATIONS

Adouby et al., "X-ray diffraction, 119Sn Mössbauer and thermal study of SnSe—Bi2Se3 system", Journal of Alloys and Compounds, vol. 453, 2008, pp. 161-166.
Guéguen et al., "Thermoelectric Properties and Nanostructuring in the p-Type Materials NaPb18-xSnxMTe20 (M = Sb, Bi)", Chemistry of Materials, vol. 21, 2009, pp. 1683-1694.
International Search Report for PCT/KR2018/005454 (PCT/ISA/210) dated Sep. 28, 2018, with English translation.

* cited by examiner

*Primary Examiner* — Sheng H Davis
(74) *Attorney, Agent, or Firm* — Birch, Stewart, Kolasch & Birch, LLP

(57) ABSTRACT

A chalcogen-containing compound of the following Chemical Formula 1 which exhibits excellent phase stability at a temperature corresponding to the driving temperature of a thermoelectric element, and also exhibits an excellent thermoelectric performance index (ZT) through an increase in a power factor and a decrease in thermal conductivity, a method for preparing the same, and a thermoelectric element including the same:

$V_{1-x}M_xSn_{4-y}Pb_yBi_2Se_{7-z}Te_z$    [Chemical Formula 1]

In the above Formula 1, V is a vacancy, M is an alkali metal, x is greater than 0 and less than 1, y is greater than 0 and less than 4, and z is greater than 0 and less than or equal to 1.

12 Claims, 10 Drawing Sheets

CHALCOGEN-CONTAINING COMPOUND, ITS PREPARATION METHOD AND THERMOELECTRIC ELEMENT COMPRISING THE SAME

CROSS-REFERENCE TO RELATED APPLICATION(S)

This application claims the benefits of the filing date of Korean Patent Application No. 10-2017-0081229 filed with the Korean Intellectual Property Office on Jun. 27, 2017, the entire contents of which are incorporated herein by reference.

TECHNICAL FIELD

The present invention relates to a novel chalcogen-containing compound which exhibits excellent phase stability at a temperature corresponding to the driving temperature of a thermoelectric element, and also exhibits an excellent thermoelectric performance index (ZT) through an increase in a power factor and a decrease in thermal conductivity, a method for preparing the same, and a thermoelectric element including the same.

BACKGROUND ART

Recently, due to resource depletion and environmental problems caused by combustion, research on thermoelectric conversion materials using waste heat as one of the alternative energy is accelerated.

Energy conversion efficiency of the thermoelectric conversion material depends on ZT, which is the thermoelectric performance index value of the thermoelectric conversion material. Here, ZT is determined according to the Seebeck coefficient, electrical conductivity, thermal conductivity, and the like as shown in the following Mathematical Formula 1, and more specifically, it is proportional to the square of the Seebeck coefficient and the electrical conductivity, and is inversely proportional to thermal conductivity:

$$ZT = \sigma S^2 / KT \qquad \text{[Mathematical Formula 1]}$$

(in Mathematical Formula 1, $\sigma$ is the electrical conductivity, S is the Seebeck coefficient, and K is the thermal conductivity).

Therefore, in order to increase the energy conversion efficiency of the thermoelectric conversion element, it is necessary to develop a thermoelectric conversion material having a high Seebeck coefficient (S) or electrical conductivity ($\sigma$), and thus exhibiting a high power factor ($PF = \sigma S^2$) or having low thermal conductivity (K).

Among various thermoelectric conversion materials which have been known for a long time, for example, a thermoelectric conversion material having a crystal lattice structure related to or similar to sodium chloride (NaCl), such as PbTe, $Bi_2Te_3$, SnSe, and the like, in which some of lattice sites are vacant, is known to exhibit excellent thermoelectric conversion characteristics. Materials having such a crystal lattice structure exhibit excellent electrical conductivity, and also exhibit low thermal conductivity as some of the lattice sites are vacant. Thus, excellent thermoelectric conversion characteristics can be exhibited.

However, thermoelectric conversion materials having a vacancy in which some of the lattice sites are vacant while having the same face-centered cubic lattice structure as that of sodium chloride are almost unknown.

Further, in the case of $Sn_4Bi_2Se_7$ which is one of Sn—Bi—Se based chalcogen-containing compounds, it has the same face-centered cubic lattice structure as that of sodium chloride, and it is known that some lattice sites, specifically about 14.3% of cationic sites, are vacant sites. For reference, FIG. 1 shows a phase stability diagram of typical Sn—Bi—Se based chalcogen-containing compounds, and in the case of $Sn_4Bi_2Se_7$, is known to have a face-centered cubic lattice structure at a temperature of about 580° C. to 720° C. (a portion indicated by a circle in FIG. 1).

However, in the case of these chalcogen-containing compounds, the phase is stably maintained only at a temperature of about 580° C. to 720° C., but decomposition occurs in other phases at a lower temperature than this, particularly at a driving temperature of the thermoelectric element, and thus phase stability is not exhibited.

As a result, it has been predicted that the chalcogen-containing compound exhibits the same face-centered cubic lattice structure as that of sodium chloride and includes some vacant lattice sites and thus exhibits low thermal conductivity and excellent thermoelectric properties. However, as it exhibits poor phase stability at a temperature of about 580° C. or lower corresponding to the general driving temperature of the thermoelectric element, there is a problem that it is very limited in application as a thermoelectric conversion material.

DETAILED DESCRIPTION OF THE INVENTION

Technical Problem

An object of the present invention is intended to provide a novel chalcogen-containing compound which exhibits excellent phase stability at a temperature corresponding to the driving temperature of a thermoelectric element, and also exhibits an excellent thermoelectric performance index (ZT) through an increase in power factor and a decrease in thermal conductivity, and a method for preparing the same.

Another object of the present invention is intended to provide a thermoelectric conversion material and a thermoelectric element which includes the above-mentioned chalcogen-containing compound and thus exhibits excellent thermoelectric properties.

Technical Solution

According to embodiments of the present invention, a chalcogen-containing compound represented by the following Chemical Formula 1 is provided:

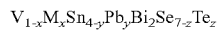

$$V_{1-x}M_xSn_{4-y}Pb_yBi_2Se_{7-z}Te_z \qquad \text{[Chemical Formula 1]}$$

wherein, in the above Formula 1, V is a vacancy, M is an alkali metal, x is greater than 0 and less than 1, y is greater than 0 and less than 4, and z is greater than 0 and less than or equal to 1.

The present invention also provides a method for preparing the above-mentioned chalcogen-containing compound including the steps of: mixing raw materials of Sn, Pb, Bi, Se, Te, and an alkali metal (M) and subjecting the mixture to a melting reaction; heat-treating the resultant product obtained through the melting reaction; pulverizing the resultant product obtained through the heat treatment; and sintering the pulverized product.

In addition, according to another embodiment of the present invention, a thermoelectric conversion material and a thermoelectric element including the chalcogen-containing compound are provided.

Hereinafter, the chalcogen-containing compound according to specific embodiments of the present invention, the method for preparing the same, and the thermoelectric element including the same will be described in more detail.

According to one embodiment of the present invention, a chalcogen-containing compound represented by the following Chemical Formula 1 is provided:

$$V_{1-x}M_xSn_{4-y}Pb_yBi_2Se_{7-z}Te_z \quad \text{[Chemical Formula 1]}$$

wherein, in the above Formula 1, V is a vacancy, M is an alkali metal, 1-x, x, 4-y, y, 2, 7-z, and z are molar ratios of V, M, Sn, Pb, Bi, Se, and Te, respectively, and x is greater than 0 and less than 1, y is greater than 0 and less than 4, and z is greater than 0 and less than or equal to 1.

The chalcogen-containing compound of the one embodiment is a compound having a vacant site to which an alkali metal (M), Pb, and Te are added to a chalcogen-containing compound such as $Sn_4Bi_2Se_7$, and has a crystal lattice structure identical to that of $Sn_4Bi_2Se_7$, that is, a face-centered cubic crystal lattice structure identical to that of sodium chloride.

Specifically, the chalcogen-containing compound of the one embodiment has a vacancy which is a vacant site excluding the sites filled with Sn, Pb, Bi, Se, and Te in the face-centered cubic lattice structure, wherein the alkali metal (M) is filled in at a least part of the vacant (V) sites.

Further, in the face-centered cubic lattice structure, the Pb is substituted by replacing some of the sites where the Sn is filled, and the Te is substituted by replacing a part of Se where Se is filled.

In addition, in the face-centered cubic lattice structure, the vacancy (V), the alkali metal (M), Sn, Pb, and Bi are randomly distributed at the site of (x, y, z)=(0, 0, 0), and in the case of Se and Te, they are randomly distributed at the site of (x, y, z)=(0.5, 0.5, 0.5).

More specifically, in the face-centered cubic lattice structure of the chalcogen-containing compound of the one embodiment, the Se is filled in an anion site of the face-centered cubic lattice, the Sn and Bi are filled in a cationic site of the face-centered cubic lattice, the Pb is substituted by replacing some of the sites where the Sn is filled, and the Te is substituted by replacing some of the sites where the Se is filled. In addition, the face-centered cubic lattice structure includes vacancies at vacant sites of the remaining cationic sites excluding the sites filled with Sn, Pb, and Bi, and the alkali metal (M) is filled in at least some of the vacancies (V).

As is also demonstrated in examples described later, the chalcogen-containing compound of the one embodiment can exhibit excellent stability at room temperature due to the addition of the alkali metal, and at the same time, the alkali metal does not completely fill the vacant lattice sites and thus some vacant sites remain, so it can exhibit low thermal conductivity. Further, the alkali metal, Sn, Pb, Bi, and the like filling each cationic site provide electrons while being formed into cations, thereby exhibiting improved electrical conductivity. Further, as Pb is substituted in some of the Sn sites, the electrical conductivity and the Seebeck coefficient increase and the thermal conductivity decreases, thereby exhibiting a remarkably excellent power factor and thermoelectric performance index (ZT). Furthermore, since a part of Se is substituted with Te, the power factor can be improved, and at the same time, the thermoelectric performance index can be improved due to a decrease in thermal conductivity.

In detail, the chalcogen-containing compound of the one embodiment can exhibit excellent phase stability even at a low temperature, specifically at a temperature range corresponding to the driving temperature of the thermoelectric element (for example, a low temperature of about 580° C. or less), because an alkali metal is added to its crystal lattice structure. Such excellent phase stability can be confirmed from the viewpoint that even when the chalcogen-containing compound of the one embodiment is finally produced in the form of a sintered body and then left to stand, decomposition of the compound does not occur, and the same XRD pattern and the same crystal structure are maintained.

At this time, as the alkali metal, at least one alkali metal selected from the group consisting of Li, Na, and K can be used, but Na can be suitably used in consideration of the high electrical conductivity and excellent phase stability of the compound of one embodiment.

Further, the chalcogen-containing compound of the one embodiment can improve the power factor (PF) and the thermoelectric performance index (ZT) since Te is contained by replacing a part of Se.

The thermoelectric performance index is defined as $ZT=S^2\sigma T/K$ (S: Seebeck coefficient, σ: electrical conductivity, T: absolute temperature, and K: thermal conductivity). The chalcogen-containing compound of one embodiment can exhibit an excellent power factor and thermoelectric performance index (ZT) due to high electrical conductivity and low thermal conductivity. Further, due to such an improvement effect, the Seebeck coefficient increases according to the increase in the Te content, and thereby the power factor can be further increased.

On the other hand, as the Te content substituted with Se increases, the lattice thermal conductivity is decreased by the point defect scattering effect of a phonon due to Te substitution, and thereby, the total thermal conductivity is also decreased.

Furthermore, the chalcogen-containing compound of the one embodiment can further improve the power factor and the thermoelectric performance index (ZT) as Pb is substituted in some of the Sn sites in the face-centered cubic lattice structure. Since Pb has a larger atomic radius than Sn, the lattice is well filled as the substitution amount of Pb increases, and thereby, the lattice parameter becomes larger. Due to such change in crystal structure and electronic structure, the greater the content of Pb substituted at the Sn site, the higher the electrical conductivity and the Seebeck coefficient. Further, as the content of Pb substituted in the Sn sites increases, the lattice thermal conductivity value is lowered due to phonon scattering. Thereby, the total thermal conductivity may be lowered. In particular, the electrical conductivity and the Seebeck coefficient affect the power factor, and the electrical conductivity, the Seebeck coefficient, and the thermal conductivity affect the thermoelectric performance index ZT value. Therefore, as the content of Pb substituted at the sites of Sn increases, the electrical conductivity and the Seebeck coefficient increase and the thermal conductivity decreases. As a result, an excellent power factor and thermoelectric performance index (ZT) can be exhibited.

Further, in the face-centered cubic lattice structure of the chalcogen-containing compound of the one embodiment, the alkali metal does not completely fill vacancies which are vacant lattice sites, and some vacant sites remain. The vacancies are in a state in which atoms of lattice points are deficient in a specific crystal lattice structure. As also demonstrated by examples described below, the vacancies play a very important role in forming the same face-centered cubic lattice structure as that of sodium chloride. If the vacancies are completely filled with the alkali metal (M), Sn, Bi, Se, and Te and eliminated, secondary phases having different structures other than the face-centered cubic lattice structure are formed together, and thus the physical properties such as electrical conductivity are lowered, and there is a problem that it is very limited in application as a thermoelectric conversion material.

In addition, since the vacancies facilitate diffusion of atoms, heat treatment, deformation, precipitation, or phase transformation may be varied depending on the presence or absence of the vacancies. In the case of the chalcogen-containing compound of the one embodiment, the low lattice thermal conductivity can be exhibited by the phonon scattering of the vacancies, and due to this, excellent thermoelectric conversion characteristics can be exhibited.

On the other hand, in Chemical Formula 1, the vacancy (V), alkali metal (M), Sn, Pb, Bi, Se, and Te are included in the molar ratio of 1-x, x, 4-y, y, 2, 7-z, and z, respectively, wherein x is greater than 0 and less than 1, y is greater than 0 and less than 4, and z is greater than 0 and less than or equal to 1. When x is 1, vacancies do not exist in the lattice structure, and a great number of secondary phases are formed in addition to the single phase NaCl structure, and therefore it is difficult to use it as a thermoelectric material. Further, when y is 4 or more, the content of Sn is 0 or less, and it deviates from a portion indicated by a circle in the diagram of FIG. 1. In addition, as shown in FIG. 3, another phase is formed and a single phase having a desired NaCl structure cannot be obtained. Considering a remarkable improvement effect due to the control of the mole ratio of each element including the vacancy, more specifically, x may be 0.05 to 0.5, y may be 0.5 to 1, and z may be 0.01 to 1, and still more specifically, x may be 0.1 to 0.4, y may be 0.6 to 1, and z may be 0.05 to 0.8. Further, under the conditions that the ranges of x and z are satisfied, x+y+z may be greater than 0 and less than or equal to 5, more specifically 0.01 to 2, or 1 to 2. As these respective mole ratios are satisfied, the compound of one embodiment may exhibit superior phase stability due to the addition of an alkali metal while maintaining a unique crystal lattice structure. Due to the vacant sites, it can exhibit low thermal conductivity. In addition, the molar ratio of the alkali metal, Bi, etc. which provide electrons, is optimized, and thus the compound can exhibit superior electrical conductivity. Furthermore, since Pb is substituted in some of the Sn sites to change the electronic structure of the chalcogen-containing compound, the electrical conductivity can be increased. As Te is substituted in a part of Se, the Seebeck coefficient increases and the thermal conductivity decreases, thereby exhibiting a remarkably excellent power factor and thermoelectric performance index (ZT).

More specifically, the chalcogen-containing compound of Chemical Formula 1 may be

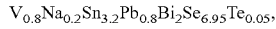

$V_{0.8}Na_{0.2}Sn_{3.2}Pb_{0.8}Bi_2Se_{6.95}Te_{0.05}$,

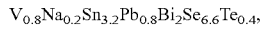

$V_{0.8}Na_{0.2}Sn_{3.2}Pb_{0.8}Bi_2Se_{6.6}Te_{0.4}$,

$V_{0.8}Na_{0.2}Sn_{3.2}Pb_{0.8}Bi_2Se_{6.2}Te_{0.8}$, and the like.

As described above, since the chalcogen-containing compound according to one embodiment of the present invention has a structure in which the alkali metal (M) is substituted with some of the vacancies in conventional $Sn_4Bi_2Se_7$ thermoelectric materials having a face-centered cubic lattice structure, the thermal conductivity is reduced by the vacancies in the lattice structure while exhibiting excellent phase stability at room temperature, particularly at the normal driving temperature thermoelectric elements. In addition, since the chalcogen-containing compound according to one embodiment of the present invention has a structure in which some of the Sn is substituted with Pb and some of Se is substituted with Te, the power factor (PF) increases and the thermal conductivity (K) decreases, thus exhibiting a remarkably improved thermoelectric performance index (ZT). As a result, the chalcogen-containing compound of the one embodiment can be very suitably used as a thermoelectric conversion material in various fields and applications including various thermoelectric cooling systems, thermoelectric power generation systems, and the like.

On the other hand, according to another embodiment of the present invention, a method for preparing the above-mentioned chalcogen-containing compound is provided.

Specifically, the preparation method may include the steps of: mixing raw materials of Sn, Pb, Bi, Se, Te, and an alkali metal (M) and subjecting the mixture to a melting reaction; heat-treating the resultant product obtained through the melting reaction; pulverizing the resultant product obtained through the heat treatment; and sintering the pulverized product.

In the above preparation method, as the raw materials containing Sn, Pb, Bi, Se, Te, and alkali metals (M), for example, shot (particle without edges) and/or a powder of Sn, Pb, Bi, Se, Te, and an alkali metal may be used. Further, the raw materials including the alkali metal are not particularly limited, but a powder of $M_2Se$ (where M is an alkali metal) may be used.

Further, the mixing of these respective raw materials can be carried out by mixing the raw materials such that the molar ratio of the respective elements in Chemical Formula 1, specifically, the molar ratio of Sn, Pb, Bi, Se, Te, and an alkali metal (M) is a ratio corresponding to 4-y:y:2:7-z:z:x, and then grinding or milling the mixture and optionally pelletizing it. At this time, x, y, and z are the same as described above. The mixture thus formed may be in a powder state, a pellet state, or an ingot state depending on its formation step.

Then, a step of melting the mixture prepared above is carried out.

During the melting step, the reaction between the metal raw materials is performed, and the result of the reaction is obtained in the form of a melt.

Specifically, the melting step can be carried out by charging the mixture into a quartz tube and heating it at a temperature of 700° C. to 800° C., and more specifically a temperature of 750° C. to 800° C. under vacuum and in a sealed state. At this time, in order to prevent the reaction between the raw material and the quartz tube, the mixture may be first placed in a carbon crucible and then charged into a quartz tube. During the melting step, the reaction between the metal raw materials is performed.

Next, prior to the subsequent heat treatment step, a step of cooling the resultant product obtained through the melt reaction, that is, the melt, can be further carried out as needed. Through this cooling step, the time of the subsequent heat treatment step can be shortened.

The cooling step may be carried out by a conventional method such as natural cooling or cold air cooling, and it can be carried out until the temperature of the melt reaches the level of room temperature (23±5° C.).

Next, a step of heat-treating the melt obtained through the melting step is carried out. The heat treatment is a step for forming a single phase of a face-centered cubic lattice structure. Specifically, it can be carried out at a temperature of 550° C. to 640° C., more specifically, 600° C. to 640° C., for 24 hours to 72 hours. Further, the heat treatment may be carried out in a furnace such as an electric furnace, and it can be carried out under a vacuum or inert gas atmosphere.

In addition, the heat treatment step may be carried out in a single step or may be performed in two or more multiple steps.

Next, after the heat treatment step, a step of pulverizing the heat-treated product is carried out.

The pulverizing step may be carried out using previously known methods and devices for producing thermoelectric conversion materials, and through this pulverizing step, a resultant product in a powder state can be obtained.

On the other hand, between the heat treatment step and the pulverization step, a step of cooling the result of the heat treatment step to form an ingot may be further carried out as needed.

At this time, the cooling step may be carried out using various cooling media, and all of the cooling devices/methods previously applied in the manufacturing process of thermoelectric conversion materials can be applied without particular limitation. In the case of forming ingots through this cooling step, a step of pulverizing the ingots may be carried out. As an example, after heat treatment, water is added for quenching. As a result, it is possible to obtain a heat treated product in an ingot state.

After the pulverizing step described above, a step of sintering the pulverized product is carried out. By progress of this sintering step, a chalcogen-containing compound can be produced in the sintered state. Such a sintering step can be carried out by a spark plasma sintering method or the like that is well-known to those skilled in the art.

The sintering step may be carried out at a temperature of 550° C. to 700° C. under a pressure of MPa to 100 MPa. More specifically, it may be carried out at a temperature of 550° C. to 640° C. under a pressure of 30 MPa to 100 MPa for 5 minutes to 10 minutes.

After the sintering step, a cooling step may be further carried out as needed.

However, each of the above-described steps may be carried out by applying conventional manufacturing conditions, methods, and devices for forming a thermoelectric conversion material or a metal compound such as a chalcogen-containing compound. Specific reaction conditions and methods are described in examples described later, and so an additional description thereof will be omitted.

On the other hand, according to another embodiment of the present invention, a thermoelectric element including the chalcogen-containing compound of the above-mentioned one embodiment as a thermoelectric conversion material is provided. Such a thermoelectric element can include the chalcogen-containing compound (thermoelectric conversion material) of the embodiment as a p-type or n-type thermoelectric conversion material. For this purpose, as the thermoelectric conversion material of the one embodiment, additional p-type or n-type elements may be included in an additionally doped state. However, the kind of p-type element or n-type element and the doping method usable herein are not particularly limited, and elements and doping methods which have been conventionally used for applying thermoelectric conversion materials as p-type or n-type may be applied.

The thermoelectric element may include a thermoelectric element formed by obtaining the p-type or n-type thermoelectric conversion materials in a sintered state, and then processing and molding it, and may also include an insulating substrate and an electrode. The coupling structure of the thermoelectric element, the insulating substrate, and the electrode may conform to the structure of a conventional thermoelectric element.

In addition, as the insulating substrate, a sapphire substrate, a silicon substrate, a Pyrex substrate, a quartz substrate, or the like can be used. As the electrode, an electrode containing an arbitrary metal or a conductive metal compound can be used.

As the above-mentioned thermoelectric element includes thermoelectric conversion material of one embodiment, it can exhibit excellent thermoelectric conversion characteristics, and the like, and it can be suitably applied to a thermoelectric cooling system or a thermoelectric power generation system in various fields and applications.

Advantageous Effects

According to the present invention, a novel chalcogen-containing compound which exhibits excellent phase stability even at a temperature corresponding to the driving temperature of a thermoelectric element, and also exhibits an excellent thermoelectric performance index (ZT) through an increase in power factor and a decrease in thermal conductivity, and a method for preparing the same, can be provided. In addition, a thermoelectric element exhibiting excellent properties by applying such chalcogen-containing compound can be provided.

DETAILED DESCRIPTION OF THE EMBODIMENTS

Figure 1:
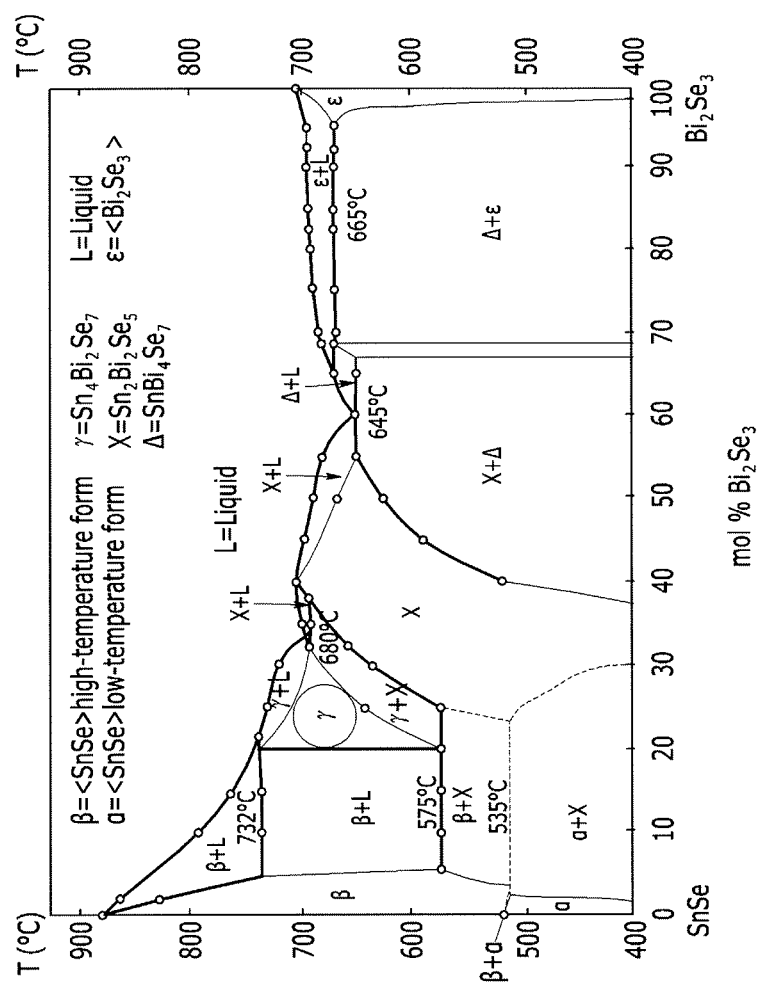
FIG. 1 is a phase stability diagram of typical Sn—Bi—Se based chalcogen-containing compounds.

Hereinafter, the present invention will be described in more detail by way of examples. However, these examples are given to merely illustrate the invention and are not intended to limit the scope of the invention thereto.

Example 1: Preparation of Chalcogen-Containing Compound ($V_{0.8}Na_{0.2}Sn_{3.2}Pb_{0.8}Bi_2Se_{6.95}Te_{0.05}$)

The respective powders of Na, Sn, Pb, Bi, Se, and Te, which are high purity raw materials, were weighed at a molar ratio of 0.2:3.2:0.8:2:6.95:0.05 in a glove box and placed in a graphite crucible, and then charged into a quartz tube. The inside of the quartz tube was evacuated and sealed. Then, the raw materials were kept at a constant temperature in an electric furnace at 750° C. for 24 hours, and slowly cooled at room temperature.

Thereafter, heat treatment was carried out at a temperature of 640° C. for 48 hours. The quartz tube in which the reaction progressed was cooled with water to obtain an ingot. The ingot was finely pulverized to a powder having a particle size of 75 μm or less, and sintered according to a spark plasma sintering method (SPS) at a pressure of 50 MPa and a temperature of 620° C. for 10 minutes to prepare a chalcogen-containing compound of $V_{0.8}Na_{0.2}Sn_{3.2}Pb_{0.8}Bi_2Se_{6.95}Te_{0.05}$.

Example 2: Preparation of Chalcogen-Containing Compound ($V_{0.8}Na_{0.2}Sn_{3.2}Pb_{0.8}Bi_2Se_{6.6}Te_{0.4}$)

A chalcogen-containing compound of $V_{0.8}Na_{0.2}Sn_{3.2}Pb_{0.8}Bi_2Se_{6.6}Te_{0.4}$ was prepared in the same manner as in Example 1, except that the respective powders of Na, Sn, Pb, Bi, Se, and Te, which are high purity raw materials, were mixed at a molar ratio of 0.2:3.2:0.8:2:6.6:0.4 in a glove box.

Example 3: Preparation of Chalcogen-Containing Compound ($V_{0.8}Na_{0.2}Sn_{3.2}Pb_{0.8}Bi_2Se_{6.2}Te_{0.8}$)

A chalcogen-containing compound of $V_{0.8}Na_{0.2}Sn_{3.2}Pb_{0.8}Bi_2Se_{6.2}Te_{0.8}$ was prepared in the same manner as in Example 1, except that the respective powders of Na, Sn, Pb, Bi, Se, and Te, which are high purity raw materials, were mixed at a molar ratio of 0.2:3.2:0.8:2:6.2:0.8 in a glove box.

Comparative Example 1: Preparation of Chalcogen-Containing Compound ($V_{0.8}Na_{0.2}Sn_4Bi_2Se_7$)

A chalcogen-containing compound $V_{0.8}Na_{0.2}Sn_4Bi_2Se_7$ was prepared in the same manner as in Example 1, except that the respective powders of Na, Sn, Bi, and Se, which are high purity raw materials, were mixed at a molar ratio of 0.2:4:2:7 in a glove box.

Comparative Example 2: Preparation of Chalcogen-Containing Compound ($NaSn_{3.95}Pb_{0.05}Bi_2Se_7$)

A chalcogen-containing compound of $NaSn_{3.95}Pb_{0.05}Bi_2Se_7$ was prepared in the same manner as in Example 1, except that the respective powders of Na, Sn, Pb, Bi, and Se, which are high purity raw materials, were mixed at a molar ratio of 1:3.95:0.05:2:7 in a glove box.

Comparative Example 3: Preparation of Chalcogen-Containing Compound ($Na_{0.2}Sn_{4.75}Pb_{0.05}Bi_2Se_7$)

A chalcogen-containing compound of $Na_{0.2}Sn_{4.75}Pb_{0.05}Bi_2Se_7$ was prepared in the same manner as in Example 1, except that the respective powders of Na, Sn, Pb, Bi, and Se, which are high purity raw materials, were mixed at a molar ratio of 0.2:4.75:0.05:2:7 in a glove box.

Comparative Example 4: Preparation of Chalcogen-Containing Compound ($Na_{0.2}Sn_{3.95}Pb_{0.05}Bi_{2.8}Se_7$)

A chalcogen-containing compound of $Na_{0.2}Sn_{3.95}Pb_{0.05}Bi_{2.8}Se_7$ was prepared in the same manner as in Example 1, except that the respective powders of Na, Sn, Pb, Bi, and Se, which are high purity raw materials, were mixed at a molar ratio of 0.2:3.95:0.05:2:8:7 in a glove box.

Reference Example: Preparation of Chalcogen-Containing Compound ($V_{0.8}Na_{0.2}Sn_{3.2}Pb_{0.8}Bi_2Se_7$)

A chalcogen-containing compound of $V_{0.8}Na_{0.2}Sn_{3.2}Pb_{0.8}Bi_2Se_7$ was prepared in the same manner as in Example 1, except that the respective powders of Na, Sn, Pb, Bi, and Se, which are high purity raw materials, were mixed at a molar ratio of 0.2:3.2:0.8:2:7 in a glove box.

Experimental Example

1. Phase Analysis According to XRD Pattern

Figure 2:
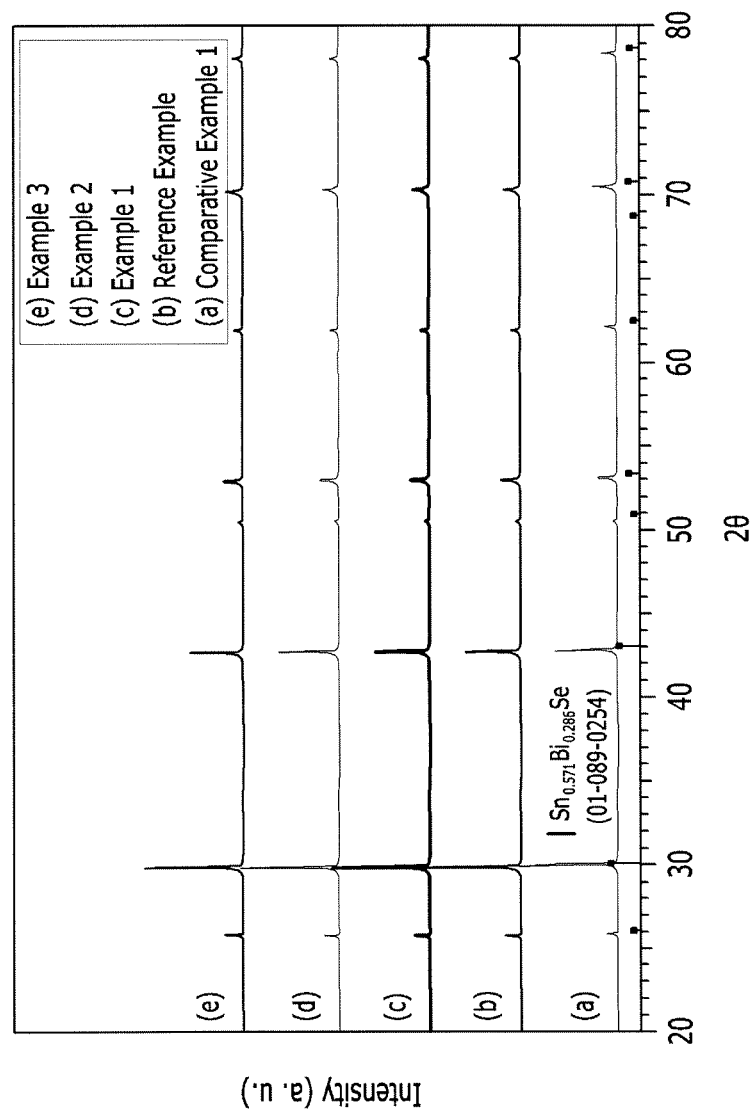
FIG. 2 is a graph showing the results of X-ray diffraction analysis of the chalcogen-containing compound powder just before the sintering step in Examples 1 to 3, Comparative Example 1, and Reference Example.
Figure 3:
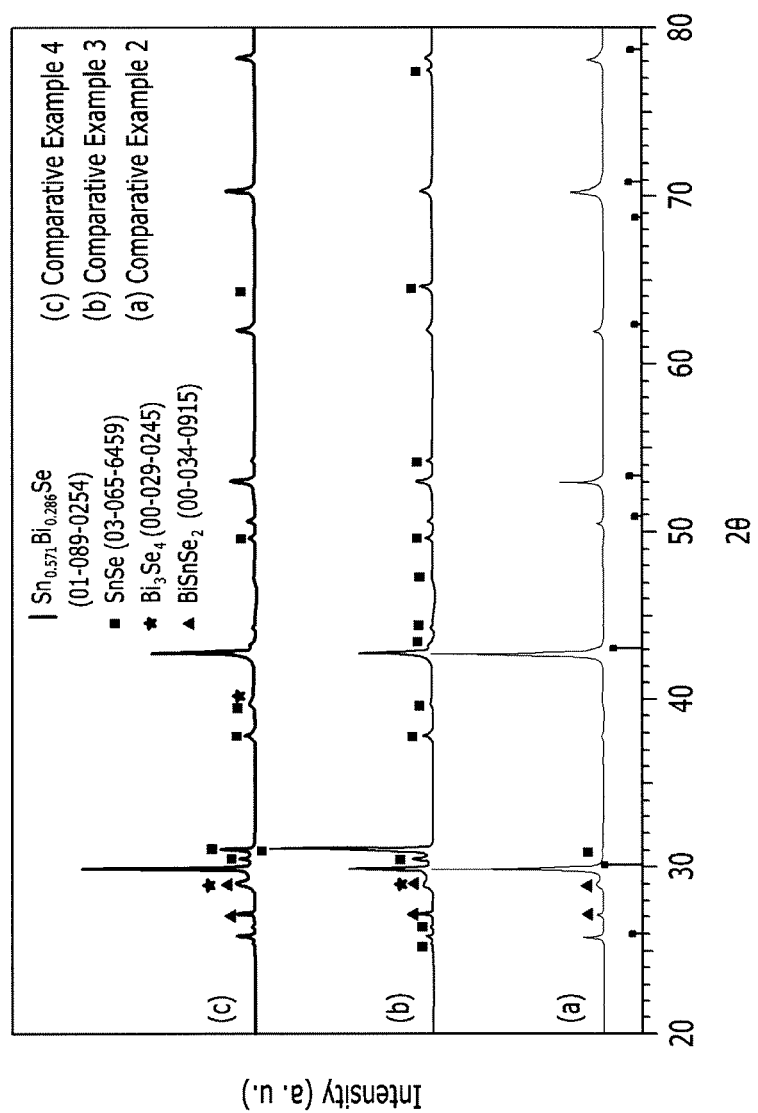
FIG. 3 is a graph showing the results of X-ray diffraction analysis of the chalcogen-containing compound powders of Comparative Examples 2 to 4.

For the chalcogen-containing compounds in a powder state just before the sintering step in Examples 1 to 3, Comparative Examples 1 to 4, and Reference Example, X-ray diffraction analysis was carried out, and the results are shown in FIG. 2 and FIG. 3. In addition, the sintered body finally produced through the sintering step in Examples 1 to 3, Comparative Example 1, and Reference Example was gradually cooled from about 620° C. to 300° C. and then cooled again to room temperature (25° C.). Then, the sintered body was maintained in the air atmosphere for 15 days, and X-ray diffraction analysis of each sintered body was performed. The results are shown in FIG. 4.

First, referring to FIG. 2, the chalcogen-containing compounds of Examples 1 to 3, Comparative Example 1, and Reference Example were confirmed to have the same crystal lattice structure as that of $Sn_4Bi_2Se_7$ which is conventionally known to have a face-centered cubic lattice structure at a high temperature. From these results, it was confirmed that the chalcogen-containing compounds of Examples 1 to 3, Comparative Example 1, and Reference Example all had a face-centered cubic crystal lattice structure.

On the other hand, referring to FIG. 3, the compounds of Comparative Examples 2 to 4 are chalcogen-containing compounds having various compositions without a vacancy site, particularly, Comparative Example 3 is a case where the content of Sn exceeds 4, and Comparative Example 4 is a case where the content of Bi exceeds 2. Although the chalcogen-containing compounds of Comparative Examples 2 to 4 were synthesized in the same manner as in Example 1, it was confirmed that in Comparative Examples 2 to 4, the vacant sites were all filled and a single phase having a face-centered cubic lattice structure could not be formed as the content of Na, Sn, or Bi increased. From these results, it was confirmed that when vacant sites exist, excellent phase stability is maintained even at a relatively low temperature.

Figure 4:
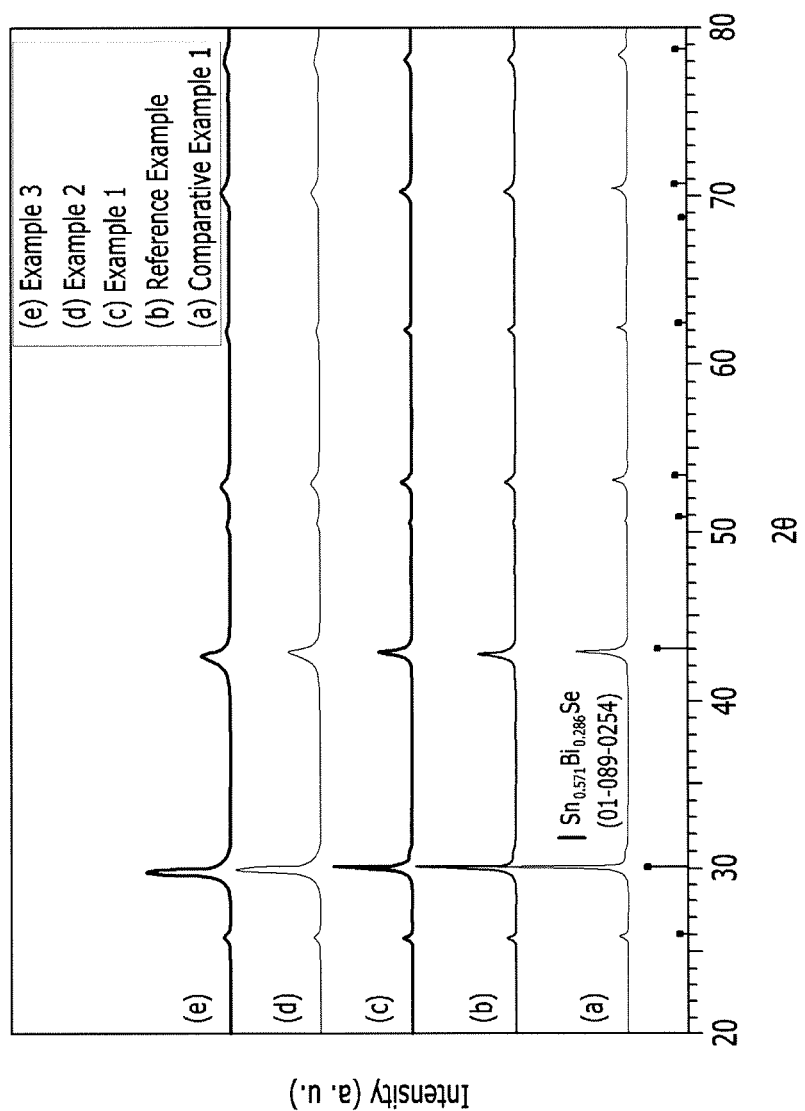
FIG. 4 is a graph showing the results of X-ray diffraction analysis after the sintered body finally produced through the sintering step in Examples 1 to 3, Comparative Example 1, and Reference Example is slowly cooled and left to stand at room temperature.

Further, referring to FIG. 4, it was confirmed that the compounds of Examples 1 to 3, Comparative Example 1, and Reference Example maintained the face-centered cubic lattice structure without generation of secondary phases and exhibited excellent phase stability, when left at a relatively low temperature. From these results, it was confirmed that the compounds of Examples 1 to 3, Comparative Example 1, and Reference Example exhibited excellent phase stability even at a relatively low temperature.

2. Rietveld Refinement Calculation

The lattice parameter and the Rietveld refinement were calculated for each of the chalcogen-containing compounds in a power state of Examples 1 to 3, Comparative Example 1, and Reference Example using the TOPAS program, and the results are shown in Table 1 below.

TABLE 1

|  | Comparative Example 1 | Reference Example | Example 1 | Example 2 | Example 3 |
| --- | --- | --- | --- | --- | --- |
| Lattice parameter (Å) | 5.9645 | 5.9816 | 5.9817 | 5.9827 | 5.9950 |
| Vacancy (0, 0, 0) occupancy | 0.1116 | 0.1143 | 0.1134 | 0.1137 | 0.1163 |
| Na (0, 0, 0) occupancy | 0.0286 | 0.0286 | 0.0286 | 0.0286 | 0.0272 |
| Sn (0, 0, 0) occupancy | 0.5741 | 0.4571 | 0.4577 | 0.4571 | 0.4569 |
| Bi (0, 0, 0) occupancy | 0.2857 | 0.2857 | 0.2857 | 0.2857 | 0.2856 |
| Pb (0, 0, 0) occupancy | — | 0.1143 | 0.1146 | 0.1149 | 0.1141 |
| Se (0.5, 0.5, 0.5) occupancy | 1 | 1 | 0.9929 | 0.9303 | 0.8933 |
| Te (0.5, 0.5, 0.5) occupancy | — | — | 0.0090 | 0.0530 | 0.1190 |
| Rwp (weighted pattern R) | 5.01 | 6.34 | 6.59 | 5.60 | 6.03 |

Referring to Table 1, it was confirmed that as the content of Te substituted in the site of Se was increased in the face-centered cubic structure, lattice parameter value gradually increased. That is, the lattice parameters were increased in the order of Example 3>Example 2>Example 1>Reference Example. From this result, it could be seen that Te having a larger atomic radius was substituted well for Se. Further, when Pb was substituted in the site of Sn, the lattice parameters of Reference Example were increased relative to Comparative Example 1. From this result, it could be seen that Pb having a larger atomic radius was substituted well for Sn.

On the other hand, it was confirmed that vacancy (V), Na, Sn, Pb, and Bi were randomly distributed in the site of (x, y, z)=(0, 0, 0), and in the case of Se and Te, they were randomly distributed in the site of (x, y, z)=(0.5, 0.5, 0.5). Further, it was confirmed that each composition contained in the chalcogen-containing compound was very similar to each molar ratio of Na, Pb, Sn, Bi, Se, and Te, which are high purity raw materials.

3. Temperature Dependence of Electrical Conductivity

Figure 5:
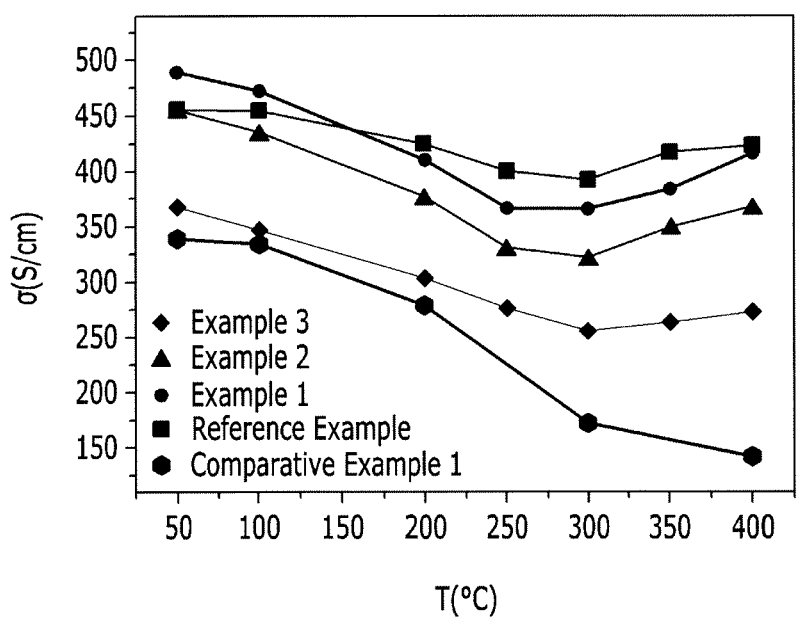
FIG. 5 is a graph showing the results of measuring electrical conductivity versus temperature of the chalcogen-containing compounds in Examples 1 to 3, Comparative Example 1, and Reference Example.

For the chalcogen-containing compound samples prepared Examples 1 to 3, Comparative Example 1, and Reference Example, the electrical conductivity was measured according to the temperature change, and the results are shown in FIG. 5. The electrical conductivity was measured at a temperature range of 50° C. to 400° C. by a four-probe DC method using a measuring device LSR-3 (manufactured by Linseis), which is a resistivity measuring device.

Referring to FIG. 5, when a part of Sn is substituted with Pb, Pb substituted at the site of Sn caused a change in the electronic structure of the chalcogen-containing compound, thereby increasing the electrical conductivity (Comparative Example 1 and Reference Example). However, as a part of Se was replaced with Te, the electrical conductivity decreased as the content of the substituted Te increased (Reference Example>Example 1>Example 2>Example 3). These results indicate that as the content of Te increases, the electron scattering due to the mass difference between Se and Te, which forms the chalcogen-containing compound frame, is further increased, and as a result, the electrical conductivity is reduced, and further, the electron concentration decreased as the content of Te increased. This can be confirmed from the fact that the bipolar effect of the Seebeck coefficient in FIG. 6 becomes larger as the Te content increases. Due to the reduction of electron mobility and electron concentration resulting from such scattering, the electrical conductivity of the chalcogen-containing compounds decreased gradually when the content of Te increased.

4. Temperature Dependence of Seebeck Coefficient

Figure 6:
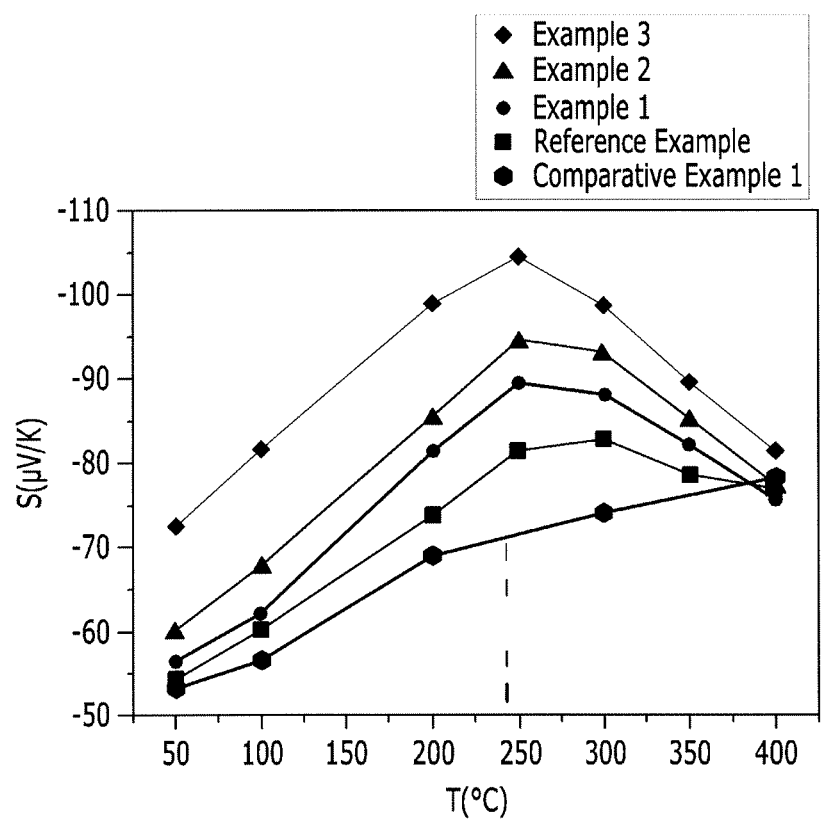
FIG. 6 is a graph showing the results of measuring the Seebeck coefficient versus temperature of the chalcogen-containing compounds in Examples 1 to 3, Comparative Example 1, and Reference Example.

For the chalcogen-containing compound samples prepared in Examples 1 to 3, Comparative Example 1, and Reference Example, the Seebeck coefficient (S) was measured according to the temperature change, and the results are shown in FIG. 6. The Seebeck coefficient was measured in a temperature range of 50° C. to 400° C. by using a measuring device LSR-3 (manufactured by Linseis) and applying a differential voltage/temperature technique.

As shown in FIG. 6, Examples 1 to 3, Comparative Example 1, and Reference Example showed a negative Seebeck coefficient. From this fact, it was confirmed that the main charge carrier of the material is electrons, which exhibited characteristics as an N-type semiconductor material.

On the other hand, in Reference Example in which a part of Sn is substituted with Pb, despite the increase in electrical conductivity as compared with Comparative Example 1, the Seebeck coefficient also increased. In Examples 1 to 3, in which a part of Se was substituted with Te and the content thereof was increased, the Seebeck coefficient values were increased as compared with Comparative Example 1 and Reference Example. From these results, it was confirmed that Examples 1 to 3 have excellent electrical properties.

5. Temperature Dependence of Power Factor

Figure 7:
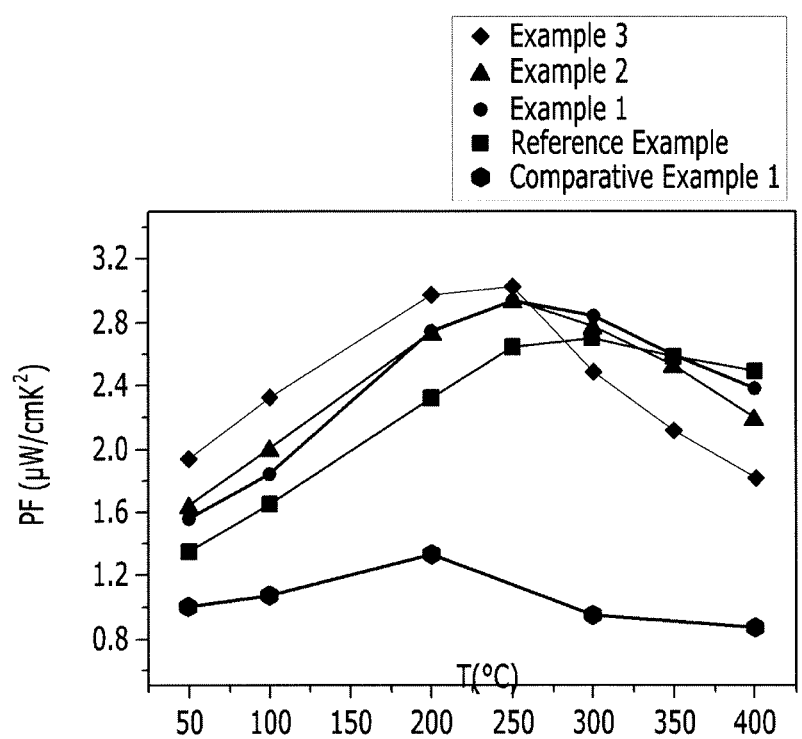
FIG. 7 is a graph showing the results of measuring the power factor versus temperature of the chalcogen-containing compounds in Examples 1 to 3, Comparative Example 1, and Reference Example.

For the chalcogen-containing compound samples prepared in Examples 1 to 3, Comparative Example 1 and, Reference Example, the power factors were calculated according to the temperature change and are shown in FIG. 7.

The power factor is defined as power factor (PF)=$\sigma S^2$, and was calculated using the values of $\sigma$ (electrical conductivity) and S (Seebeck coefficient) shown in FIG. 5 and FIG. 6.

As shown FIG. 7, it was confirmed that the chalcogen-containing compounds of Examples 1 to 3 and Reference Example in which Pb was substituted for a part of Sn exhibited excellent power factors as compared with Comparative Example 1. In addition, Examples 1 to 3, in which Te was further substituted for a part of Se, showed a high power factor at 50° C. to 250° C. as compared with Reference Example.

Figure 8:
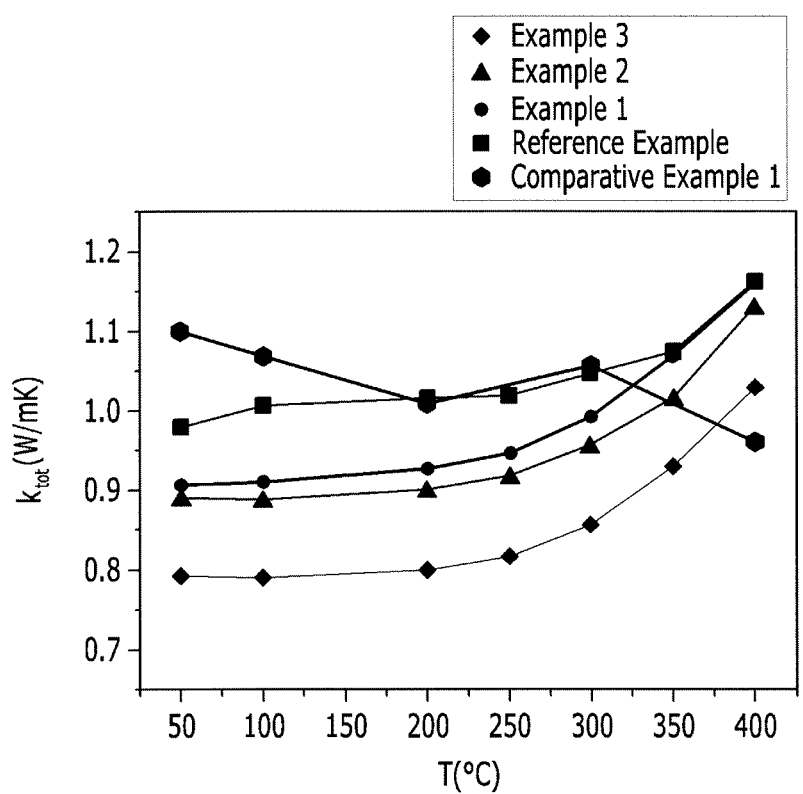
FIG. 8 is a graph showing the results of measuring the total thermal conductivity versus temperature of the chalcogen-containing compounds in Examples 1 to 3, Comparative Example 1, and Reference Example.
Figure 9:
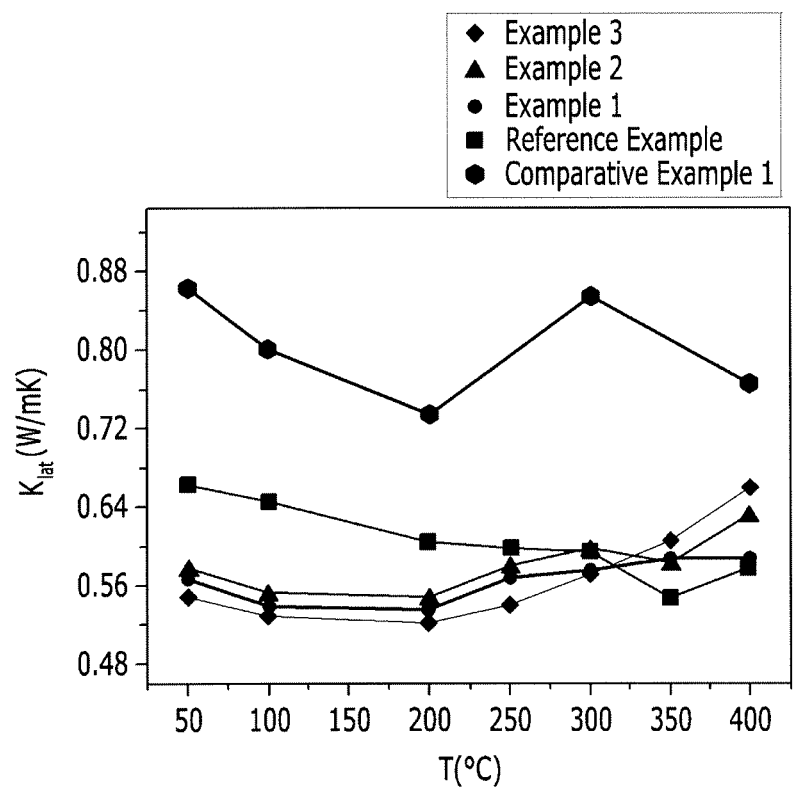
FIG. 9 is a graph showing the results of calculating the lattice thermal conductivity versus temperature of the chalcogen-containing compounds in Examples 1 to 3, Comparative Example 1, and Reference Example.

6. Temperature Dependence of Total Thermal Conductivity and Lattice Thermal Conductivity For the chalcogen-containing compound samples prepared in Examples 1 to 3, Comparative Example 1, and Reference Example, the total thermal conductivity and the lattice thermal conductivity were measured according to the temperature change, and the results are shown in FIG. 8 and FIG. 9, respectively. In the measurement of the thermal conductivity, first, the thermal diffusivity (D) and the thermal capacity (Cp) were measured by applying a laser scintillation method and using an LFA457 instrument (manufactured by Netzsch) which is a device for measuring the thermal conductivity. The thermal conductivity (k) was calculated by applying the measured value to the equation of "thermal conductivity (k)=DρC$_p$ (ρ is the density of sample measured by Archimedes method)".

In addition, the total thermal conductivity (k=k$_L$+k$_E$) is divided into the thermal conductivity (k$_E$) calculated according to the lattice thermal conductivity (k$_L$) and the Wiedemann-Franz law (k$_E$=LσT), wherein the value calculated from the Seebeck Coefficient versus temperature was used as the Lorentz number (L).

Referring to FIG. 8, Examples 1 to 3, in which Pb and Te were simultaneously substituted, showed low thermal conductivity as compared with Comparative Example 1 and Reference Example, and in particular, as the Te content increased, the total thermal conductivity decreased.

On the other hand, referring to FIG. 9, all the chalcogen-containing compounds of Examples 1 to 3, Comparative Example 1, and Reference Example exhibited low lattice thermal conductivities, and this is due to phonon scattering by the vacancy (V) of the face-centered cubic lattice structure. In the case of Reference Example in which Pb is substituted exhibited lower lattice thermal conductivity as compared with Comparative Example 1. In the case of Examples 1 to 3 in which Te is further substituted together with Pb substitution, they exhibited lower lattice thermal conductivity as compared with Reference Example. This is because the phonon scattering effect due to the mass difference between Pb and Sn, and between Se and Te, simultaneously functioned. Particularly, in the case of Example 3, the lattice thermal conductivity at 250° C. was found to be very low, at about 0.54 W/mK.

7. Temperature Dependence of Thermoelectric Performance Index (ZT)

Figure 10:
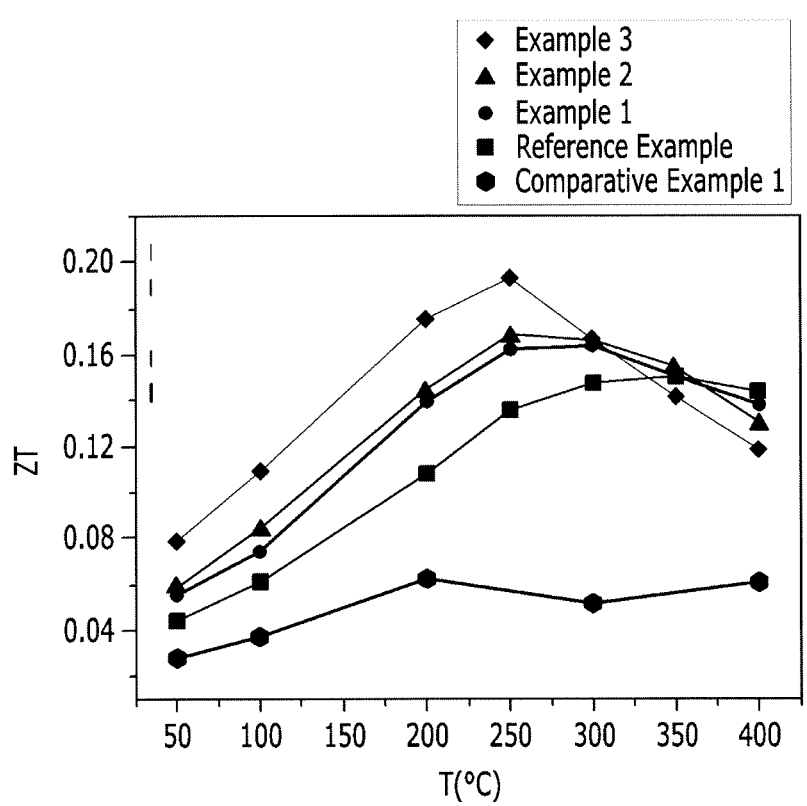
FIG. 10 is a graph showing the results of calculating the thermoelectric performance index versus temperature of the chalcogen-containing compounds in Examples 1 to 3, Comparative Example 1, and Reference Example.

For the chalcogen-containing compound samples prepared in Examples 1 to 3, Comparative Example 1, and Reference Example, the thermoelectric performance index was calculated according to temperature change, and the results are shown in FIG. 10.

The thermoelectric performance index (ZT) is defined as ZT=S$^2$σT/k, and was calculated by using the values of S (Seebeck coefficient), σ (electrical conductivity), T (absolute temperature), and k (thermal conductivity) obtained in Experimental Examples.

Referring to FIG. 10, it was confirmed that Examples 1 to 3 exhibit thermoelectric performance indices that are applicable to thermoelectric materials. In Comparative Example 1 and the reference example, ZT was increased by substituting Pb for a part of the Sn site. In Examples 1 to 3, Te was substituted for a part of Se, and as the substitution amount of Te increased, the ZT value was further increased. In particular, at 250° C., the ZT value of Example 3 increased by 220% and 40%, respectively, compared to the ZT values of Comparative Example 1 and the reference example.

The invention claimed is:

1. A chalcogen-containing compound represented by the following Chemical Formula 1:

$$V_{1-x}M_xSn_{4-y}Pb_yBi_2Se_{7-z}Te_z \qquad \text{[Chemical Formula 1]}$$

wherein, in the above Formula 1, V is a vacancy, M is an alkali metal, x is greater than 0 and less than 1, y is greater than 0 and less than 4, and z is greater than 0 and less than or equal to 1, wherein the chalcogen-containing compound has a face-centered cubic crystal lattice structure, the Se is filled in an anion site of the face-centered cubic lattice structure, the Sn, Pb, and Bi are filled in a cation site of the face-centered cubic lattice structure, the Pb is substituted by replacing a part of the Sn, the Te is substituted by replacing a part of the Se, the M is filled in at least some of vacant sites excluding the sites filled with Sn, Pb, Bi, Se, and Te in the face-centered cubic lattice structure, and the V is a vacant site of the remaining cationic sites.

2. The chalcogen-containing compound of claim 1, wherein the M is at least one alkali metal selected from the group consisting of Li, Na, and K.

3. The chalcogen-containing compound of claim 1, wherein the V, M, Sn, Pb, and Bi are randomly distributed at the site of (x, y, z)=(0, 0, 0), and Se and Te are randomly distributed at the site of (x, y, z)=(0.5, 0.5, 0.5).

4. The chalcogen-containing compound of claim 1, wherein the x+y+z is greater than 0 and less than or equal to 5.

5. The chalcogen-containing compound of claim 1, wherein the compound is selected from the group consisting of $V_{0.8}Na_{0.2}Sn_{3.2}Pb_{0.8}Bi_2Se_{6.95}Te_{0.05}$, $V_{0.8}Na_{0.2}Sn_{3.2}Pb_{0.8}Bi_2Se_{6.6}Te_{0.4}$, and $V_{0.8}Na_{0.2}Sn_{3.2}Pb_{0.8}Bi_2Se_{6.2}Te_{0.8}$.

6. A method for preparing the chalcogen-containing compound of claim 1, represented by the following Chemical Formula 1:

$$V_{1-x}M_xSn_{4-y}Pb_yBi_2Se_{7-z}Te_z \qquad \text{[Chemical Formula 1]}$$

wherein, in the above Formula 1, V is a vacancy, M is an alkali metal, x is greater than 0 and less than 1, y is greater than 0 and less than 4, and z is greater than 0 and less than or equal to 1, comprising the steps of:

mixing raw materials of Sn, Pb, Bi, Se, Te, and an alkali metal (M) and subjecting the mixture to a melting reaction;

heat-treating the resultant product obtained through the melting reaction;

pulverizing the resultant product obtained through the heat treatment; and sintering the pulverized product, wherein the mixing of raw materials is carried out by mixing the raw materials such that the molar ratio of Sn, Pb, Bi, Se, Te, and an alkali metal (M) is a ratio corresponding to 4-y:y:2:7-z:z:x.

7. The method for preparing the chalcogen-containing compound of claim 6, wherein the melting is carried out at a temperature of 700° C. to 800° C.

8. The method for preparing the chalcogen-containing compound of claim 6, wherein the heat treatment is carried out at a temperature of 550° C. to 640° C.

9. The method for preparing the chalcogen-containing compound of claim 6, further comprising a step of cooling the result of the heat treatment step to form an ingot between the heat treatment step and the pulverization step.

10. The method for preparing the chalcogen-containing compound of claim 6, wherein the sintering step is carried out by a spark plasma sintering method.

11. The method for preparing the chalcogen-containing compound of claim 6, wherein the sintering step is carried out at a temperature of 550° C. to 700° C. under a pressure of 10 MPa to 100 MPa.

12. A thermoelectric element comprising the chalcogen-containing compound according to claim 1.

* * * * *